United States Patent
Macias et al.

(10) Patent No.: US 11,519,993 B2
(45) Date of Patent: Dec. 6, 2022

(54) CURRENT SENSOR CONFIGURATION AND CALIBRATION

(71) Applicant: TEXAS INSTRUMENTS INCORPORATED, Dallas, TX (US)

(72) Inventors: Erick Macias, McKinney, TX (US); James Daniel Evans, Carrollton, TX (US); Kripasagar Kay Venkat, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 16/522,446

(22) Filed: Jul. 25, 2019

(65) Prior Publication Data

US 2020/0033435 A1    Jan. 30, 2020

Related U.S. Application Data

(60) Provisional application No. 62/712,123, filed on Jul. 30, 2018.

(51) Int. Cl.
*G01R 15/18* (2006.01)
*G01R 35/00* (2006.01)
*H03M 1/12* (2006.01)
*G01R 15/14* (2006.01)

(52) U.S. Cl.
CPC ......... *G01R 35/005* (2013.01); *G01R 15/148* (2013.01); *G01R 15/181* (2013.01); *H03M 1/1295* (2013.01)

(58) Field of Classification Search
CPC .... G01R 35/005; G01R 35/02; G01R 15/148; G01R 35/04; G01R 15/181; H03M 1/1295
See application file for complete search history.

(56) References Cited

U.S. PATENT DOCUMENTS

| 5,017,860 A | 5/1991 | Germer et al. |
| 6,377,037 B1 * | 4/2002 | Burns ................ G01R 21/133 324/107 |
| 2014/0097691 A1 | 4/2014 | Jackson et al. |
| 2015/0061636 A1 | 3/2015 | Tsai et al. |

(Continued)

OTHER PUBLICATIONS

PCT Search Report dated Oct. 24, 2019.

(Continued)

*Primary Examiner* — Lee E Rodak
*Assistant Examiner* — Brent J Andrews
(74) *Attorney, Agent, or Firm* — Krista Y. Chan; Charles A. Brill; Frank D. Cimino

(57) ABSTRACT

A system and method for phase and gain calibration of a current sensor system. The system comprises a microcontroller configured to execute software in an energy measurement component and a calibration computer having a calibration application. The energy measurement component receives first and second digital signals representing current and voltage signals, respectively, received from a test source, and calculates active power and a power factor, and provides those values to the calibration computer. The power factor is converted to a converted phase angle. Based on the information received from the energy measurement component, the calibration application calculates parameters used to update components within the microcontroller to maximize the accuracy of the current sensor system.

20 Claims, 2 Drawing Sheets

(56) References Cited

U.S. PATENT DOCUMENTS

2017/0003339 A1* 1/2017 Zhao .................. G01R 31/3008
2017/0269134 A1* 9/2017 Fu ........................ G01R 35/005
2017/0316135 A1* 11/2017 Johnson ................ G01R 35/04

OTHER PUBLICATIONS

Texas Instruments. "Three Phase Rogowski Coil Based E-Meter Solution." TI Designs. TIDU474—Sep. 2014. pp. 1-26.
Extended European Search Report received for EP Application No. 19843555.4 dated Sep. 3, 2021, 6 pages.

* cited by examiner

CURRENT SENSOR CONFIGURATION AND CALIBRATION

This application claims priority to U.S. Provisional Application No. 62/712,123 filed Jul. 30, 2018, the content of which is incorporated by reference herein.

BACKGROUND

Power and energy measurement may be performed using digital processors and sensors, including Rogowski coils. Rogowski cons generate a differential voltage that is proportional to the rate of change of the current flowing through them. Thus, Rogowski coils measure current, and output the value of that measurement as a voltage representing the value of the current. Rogowski coil sensor systems are generally calibrated to ensure, for example, that the sensor system that processes the Rogowski coil measurements is accurate.

SUMMARY

Examples described herein include a method for phase calibration of a current sensor. The method comprises converting a first signal representing a measured current to a first digital signal using a first analog-to-digital converter and converting a second signal representing a measured voltage to a second digital signal using a second analog-to-digital converter. The method further comprises calculating a calculated phase angle between the first digital signal and the second digital signal and calculating a phase difference by subtracting a test source phase angle from the calculated phase angle. The method also comprises calculating a total sample delay between the first digital signal and the second digital signal by dividing the phase difference by a fractional sample resolution representing an angle that a phase of the first digital signal will shift based on changing a preload parameter of the first analog-to-digital converter by one unit, wherein the preload parameter represents a delay before the first analog-to-digital converter begins sampling. The method further comprises calculating an updated preload parameter as the total sample delay mod an oversampling rate of the first analog-to-digital converter.

Another example described herein includes a method for gain calibration of active power. The method comprises using a microcontroller to convert a first signal representing a measured current to a first digital signal and using the microcontroller to convert a second signal representing a measured voltage to a second digital signal. The method further comprises using the first and second digital signals to calculate an active power based on an existing scaling factor. The method also comprises calculating a phase angle between the first and second digital signals and using the phase angle and active power to calculate an updated scaling factor.

The methods for gain calibration of active power and phase calibration may be initiated by a computer and performed automatically in a "one-touch" manner.

Another example described herein is a system for calibrating a current sensor. The system comprises an energy measurement component configured to receive a first digital signal from a first analog-to-digital converter a second digital signal from a second analog-to-digital converter corresponding, respectively, to a first signal representing current measured from a test source and a second signal representing voltage measured from a test source, to calculate an active power based on the first and second digital signals and an existing scaling factor and to calculate a power factor based on the active power. The system also comprises a calibration computer. The calibration computer is configured to receive the active power and power factor from the energy measurement component and convert the power factor to a converted phase angle. The calibration computer is further configured to calculate an updated scaling factor using the converted phase angle and the active power and calculate a phase difference by subtracting a phase angle of the test source from the converted phase angle. The calibration computer is also configured to calculate a total sample delay between the first and second digital signals for the first analog-to-digital converter by dividing the phase difference by a fractional sample resolution representing an angle of a phase of the first digital signal based on changing a preload parameter of the first analog-to-digital converter by one unit, wherein the preload parameter represents a delay before the first analog-to-digital converter begins sampling, and calculate an updated preload parameter as the total sample delay mod an oversampling rate of the first analog-to-digital converter.

BRIEF DESCRIPTION OF THE DRAWINGS

For a detailed description of various examples, reference will now be made to the accompanying drawings in which.

DETAILED DESCRIPTION

Calibrating sensor systems, for example Rogowski coil sensor systems, presents several challenges. For example, characterizing (i.e., measuring the output attributes of) the Rogowski cons and the sensor circuitry to be calibrated may take significant time and effort. For example, characterization with respect to phase may involve applying current to a Rogowski coil and using an oscilloscope to measure the shift in phase angle between the input and the output. Characterization may also require exposure to dangerous current and voltage in the Rogowski coil and associated circuitry.

Once characterized, calibrating the Rogowski coil sensors may be challenging due to inherent phase shifts between the input and the output and scaling small output amplitudes. In addition, the calibration may be manual, which is time consuming and not scalable. Manual calibration, for example of phase and/or gain, may involve multiple manual steps and/or trial-and-error that, when applied for example to scaling small amplitudes and phase shifts between input and output, may result in inaccurate power and energy measurements.

Examples of sensor calibration systems described herein reduce phase-shifts and amplitude variations by improving the accuracy of the calibration. Moreover, examples of sensor calibration systems described herein improve safety by eliminating exposure to high voltage and current during characterization. Examples of Rogowski coil sensor calibration systems described herein also reduce the time required for calibration by, for example, eliminating much of the manual characterization requirements and/or by calibrating different aspects of the sensor (e.g., gain and phase) in a "one touch" manner. That is rather than performing the steps for gain and phase calibration manually and separately, a calibration computer may be used to initiate a calibration method, which will perform both gain and phase calibration, and the characterization and calibration will be automated.

Figure 1:
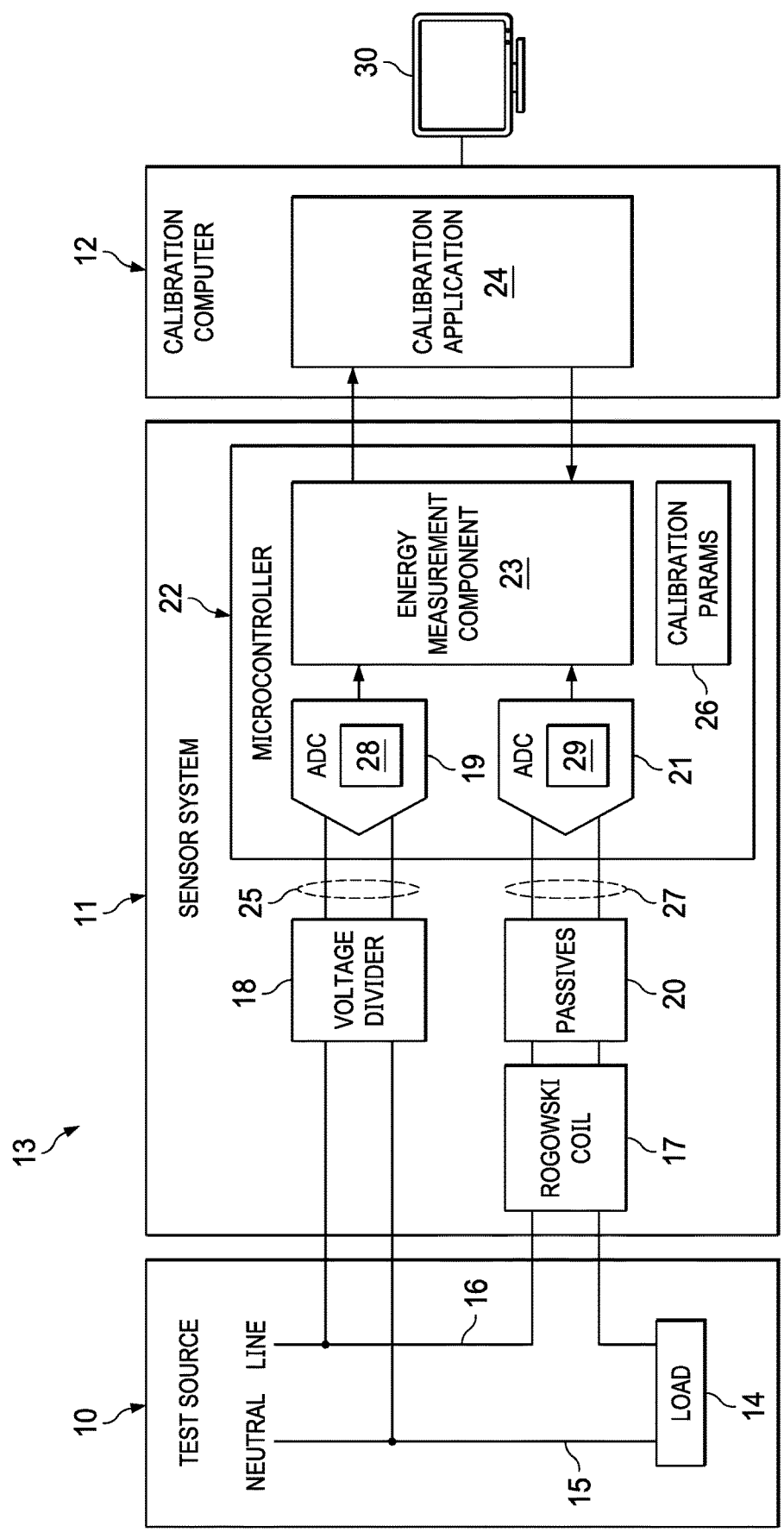
FIG. 1 illustrates an example of a calibration system described herein.

FIG. 1 shows a block diagram of an illustrative calibration system 13 described herein. Calibration system 13 comprises a test source 10, a calibration sensor system 11 and a calibration computer 12. Generally, test source 10 and calibration computer 12 are coupled to sensor system 11 and are configured to calibrate sensor system 11. Test source 10 generates a single phase loading configuration which includes neutral 15 and line 16 supplied to a load 14. In other examples, a multi-phase configuration may be implemented (e.g., a three-phase implementation).

Sensor system 11 includes Rogowski coil 17 that is coupled to, and receives a current from, line 16. Rogowski coil 17 outputs a voltage that is proportional to the rate of change (based, for example, on in the inherent variations of AC current) of the current on line 16. Passive circuits 20 perform, for example, low pass filtering of higher frequencies and output a signal 27 representing the current measured by the Rogowski coil, the signal output by the passive circuits 20 hereinafter being referred to as the "current signal." Sensor system 11 further includes voltage divider 18, which is coupled to neutral 15 and line 16. Voltage divider 18 produces an output voltage signal 25 that is a reduced form of the voltage on line 16 with respect to neutral 15. In one example, the voltage divider 18 comprises a resistor divider.

Sensor system 11 also includes a microcontroller 22 having analog-to-digital converters (ADCs) 19 and 21 and an energy measurement component 23. The ADCs 19 and 21 may be, for example, sigma delta ($\Sigma\Delta$) ADCs. ADC 19 samples the voltage signal 25 output from the voltage divider 18 and ADC 21 samples the current signal 27 output from the passives 20. ADCs 19 and 21 have registers 28 and 29, respectively, that store preload parameters which allow for configuring a delay before the ADC begins sampling. Inherent phase shifts in, for example, Rogowski coil 17 and passive circuits 20 may result a difference in the phase angle of test source 10 and the current and voltage measured by the sensor system 11. The preload parameters allow a delay to be configured in one or both of ADCs 19 and 21 to reduce that phase difference. In one example, the preload of ADC 19 is set to zero so that no delay is added to the voltage sampling of the voltage signal 25, and the preload parameter for the ADC 21 may be set to a whole number higher than zero to delay the current sampling of the current signal 27 with respect to the voltage. ADCs 19 and 21 provide the converted digitals signal to energy measurement component 23.

Energy measurement component 23 is stored in memory in the microcontroller 22 and executed by the core of the microcontroller. Energy measurement component 23 may include, for example, software libraries configured to perform calculations on the sampled data. Microcontroller 22 also has memory 26 that stores configuration parameters that are used in the calculations performed by energy measurement component 23 and calibrated by calibration system 13. For example, because the voltage and current digital signals output from ADCs 19 and 21 have reduced values as a result of the analog-to-digital conversion process, memory 26 may store a scaling factor used by the energy measurement component 23 to scale the digital signals from the ADCs 19 and 21 into real-world values (e.g., watts, volts). Memory 26 may be, for example, a flash memory.

Calibration computer 12 comprises calibration application 24, which may optionally include a graphical user interface (GUI) that may be displayed on, for example, computer monitor 30. Parameters (e.g., current, voltage and phase) of the voltage and current on line 16 of test source 10 are provided to the calibration application 24 on calibration computer 12 by, for example, manual entry into the GUI of calibration application 24 or by sending the parameter values from the test source 10 to the calibration computer 12 via a digital communication protocol. As explained in more detail in the following figures, the calibration application 24 generally compares parameters calculated by the sensor system 11 when measuring test source 10 with the actual parameters provided by the test source 10 and generates new configuration parameters (e.g., scaling factor, preload) for the sensor system 11 and provides them to the microcontroller 22 to update the configuration of the ADC 21 and/or energy measurement component 23 to maximize the accuracy of sensor system 11.

Figure 2:
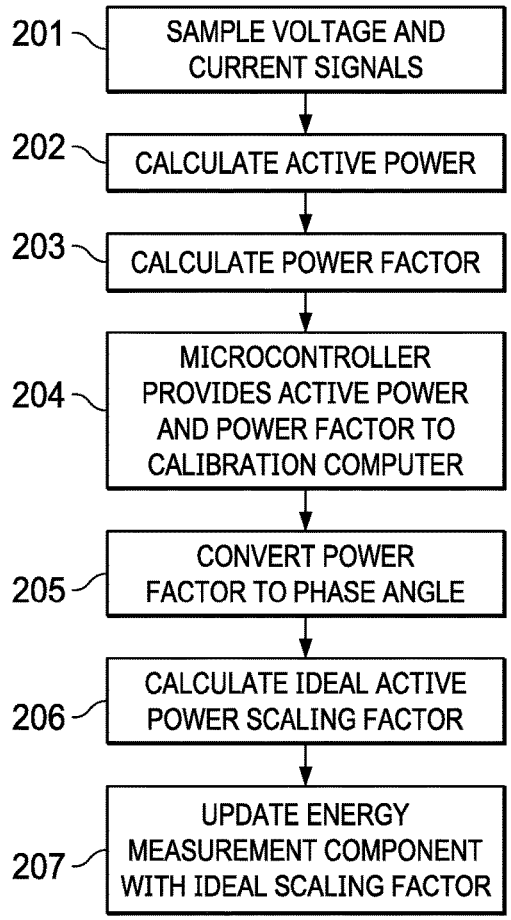
FIG. 2 illustrates an example of a method for calibrating gain using the illustrative calibration system of FIG. 1.
Figure 3:
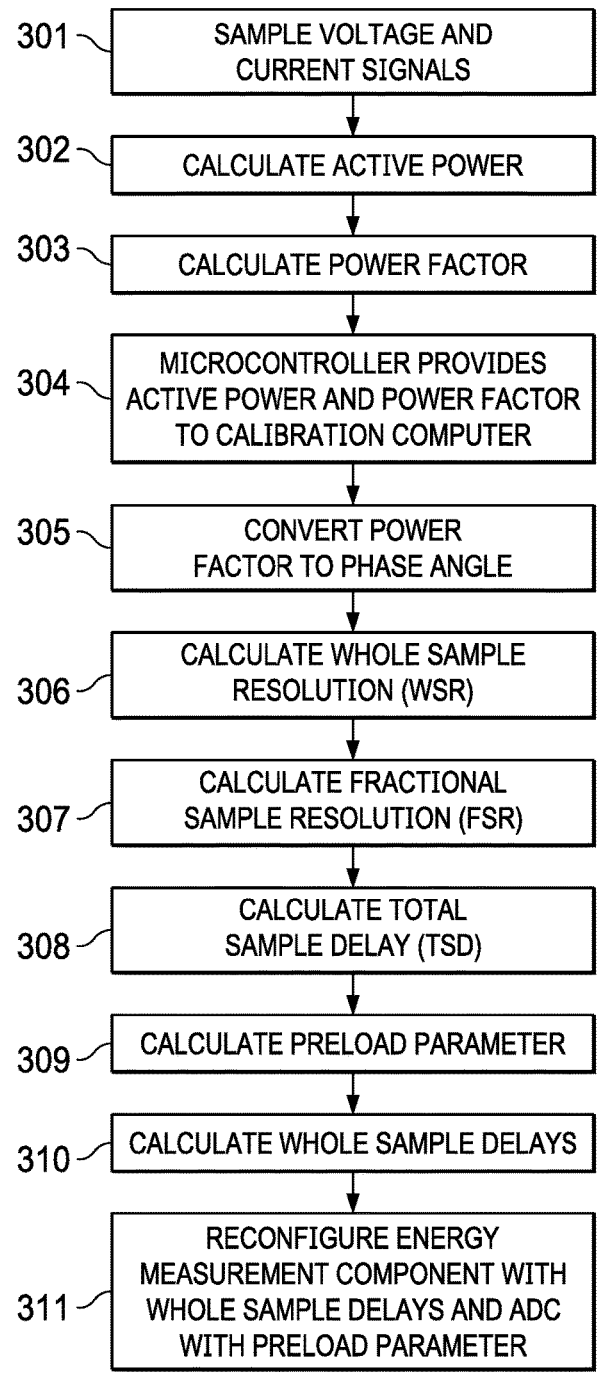
FIG. 3 illustrates an example of a method for calibrating phase using the illustrative calibration system of FIG. 1.

As described above, calibrating current sensors may involve, for example, gain and phase calibration. FIG. 2 shows an illustrative method for gain calibration of active power per phase of sensor system 11, which involves calculating a new active power scaling factor to allow the energy measurement component 23 to more accurately calculate active power based on the digital voltage and current signals received from ADCs 19 and 21. In the example where the test source provides single phase power to the load 14, the gain calibration of active power per phase would be for that single phase. FIG. 3 shows an illustrative method for phase calibration of sensor system 11, which involves calculating a new preload parameter and other parameters (described below) that impact phase. In the "one-touch" example, the method of FIG. 2 and the method of FIG. 3 are performed sequentially, with either method being performed first.

Referring to FIG. 2, at step 201, ADCs 19 and 21 sample the voltage signal 25 and current signal 27, respectively, thereby generating a digital signal representing the voltage (hereinafter a "digital voltage signal") and a digital signal representing the current (hereinafter a "digital current signal"). The digital voltage signal comprises a set of voltage samples and the digital current signal comprises a set of current samples. At step 202, the microcontroller executes the software in energy measurement component 23 to calculate the active power per phase ($P_{ACT,ph}$) using, for example, the following equation:

$$P_{ACT,ph} = K_{ACT,ph} \times \frac{\sum_{n=1}^{Sample\ Count} v(n) \times i(n)}{Sample\ Count}$$

where $K_{ACT,ph}$ comprises the active power scaling factor per phase stored in memory 26, Sample Count comprises the number of samples taken by ADCs 19 and 21, and v(n) and i(n) comprise, respectively, the voltage and current measured at sample n. The number of samples may depend on, for example, how often measurements are taken. In this example, the ADC (e.g., ADC 19, ADC 21) concludes sampling for a measurement when a new measurement begins, thereby generating a value for Sample Count. Active power ($P_{ACT,ph}$) is the power consumed by the resistive portion of the circuit (e.g., load 14).

At step 203, the microcontroller executes the software in energy measurement component 23 to calculate the power factor per phase generated by test source 10. The power factor is the ratio of the active power ($P_{ACT,ph}$) to the apparent power applied to the circuit (apparent power comprises active power and reactive power). At step 204, the calculated active power per phase and power factor per phase are then provided to the calibration computer 12 by the microcontroller 22. At step 205, the calibration application 24 converts the power factor to a phase angle between the digital voltage and current signals per phase ($\Theta_{calculated,ph}$) by, for example, calculating the inverse cosine of the power factor and determining the sign of the angle based on the sign of reactive power. At step 206, the calibration application 24 on the calibration computer 12 calculates an ideal active power scaling factor per phase ($K'_{ACT,ph}$) using, for example, the following equation:

$$K'_{ACT,ph} = K_{ACT,ph} \times \frac{V_{ideal} I_{ideal} \cos\theta_{calculated, ph}}{P_{ACT, ph}}$$

where $K_{ACT,ph}$ is the existing active power scaling factor per phase, $V_{ideal}$ and $I_{ideal}$ are, respectively, the voltage and current values of the test source 10, $\Theta_{calculated,ph}$ is the phase angle between voltage and current per phase resulting from the conversion in step 205 and $P_{ACT,ph}$ is the active power per phase calculated at step 202. Here, "ideal" refers to a scaling factor that would result in more accurate calculations by the energy measurement component 23 than the existing scaling factor ($K_{ACT,ph}$).

At step 207, the calibration application 24 provides the ideal scaling factor ($K'_{ACT,ph}$) to microcontroller 22, which updates the energy measurement component 23 with the ideal scaling factor ($K'_{ACT,ph}$), thereby effecting increased gain calibration of active power. The ideal scaling factor may be provided to microcontroller 22 in any known manner and stored in memory 26 to replace the existing scaling factor ($K_{ACT,ph}$). For example, calibration application 24 may generate code that is provided to memory 26 in the microcontroller 22, or calibration application 24 may provide the ideal scaling factor to energy management component 23, which then uses the ideal scaling factor to update the software running on microcontroller 22.

FIG. 3 shows an illustrative method for phase calibration of sensor system 11. At step 301, ADCs 19 and 21 sample the voltage signal 25 and current signal 27, respectively. At step 302, the microcontroller executes the software in energy measurement component 23 to calculate the active power per phase ($P_{ACT,ph}$) using, for example, the following equation:

$$P_{ACT,ph} = K_{ACT, ph} \times \frac{\sum_{n=1}^{Sample\ Count} v(n) \times i(n)}{Sample\ Count}$$

where $K_{ACT,ph}$ is the existing active power scaling factor per phase, Sample Count is the number of samples taken by ADCs 19 and 21 and v(n) and i(n) are, respectively, the voltage and current measured at sample n.

At step 303, the microcontroller executes the software in energy measurement component 23 to calculate the power factor per phase generated by test source 10. At step 304, the calculated active power per phase and power factor per phase are then provided to the calibration computer 12. At step 305, the calibration application 24 converts the power factor to a phase angle between the digital voltage and digital current signals per phase ($\Theta_{calculated,ph}$).

If the gain calibration of FIG. 2 has already been performed and the power factor was therefore already calculated and converted (e.g., in the "one touch" example), steps 301-305 need not be performed again, and instead the values from steps 201-205 of the gain calibration may be used in the following steps of FIG. 3. Alternatively, if the phase calibration of FIG. 3 is performed first, for example as part of the "one touch" method, steps 201-205 may be skipped and the values from steps 301-305 of the phase calibration may be used in steps 206 and 207 of FIG. 2.

At step 306, the calibration application 24 on the calibration computer 12 calculates the whole sample resolution (WSR), which is the angle between ADC 21 samples in one period of the current signal. The whole sample resolution may be calculated using, for example, the following equation:

$$WSR = \frac{F_{signal}}{F_{sampling}} \times 360°$$

where $F_{signal}$ is the frequency of the signal from test source 10 (e.g., AC mains of 50 or 60 Hz), $F_{sampling}$ is the sampling frequency of the ADCs 19 and 21 (e.g., 4 kHz or 8 kHz) and multiplying by 360° converts the result to degrees. This value could also be in other units of measure, for example in radians, which would entail multiplying by $2\pi$ rather than 360°.

At step 307, the calibration application 24 on the calibration computer 12 calculates the fractional sample resolution (FSR) using, for example, the following equation:

$$FSR = \frac{WSR}{OSR}$$

where WSR is the whole sample resolution calculated in step 306, and OSR is the oversampling rate of the ADC 21. In one example, the oversampling rate comprises a number that is a power of 2 (e.g., 64, 128, 256, etc.). The oversampling rate of ADC 19 may be the same or different than the oversampling rate of ADC 21. The fractional sample resolution represents the angle the phase of the current signal will shift based on changing the preload parameter of ADC 21 by one unit. If whole sample resolution is calculated in radians rather than degrees, fractional sample resolution represents the number of radians the phase of the current signal will shift based on changing the preload parameter of ADC 21 by one unit. The preload parameter of an ADC is the fractional delay before the ADC samples the corresponding input signal.

At step 308, the calibration application 24 on the calibration computer 12 calculates the total sample delay (TSD), which includes the whole and fractional delays in units of preload, between voltage and current samples using, for example, the following equation:

$$TSD = \left[ \frac{\theta_{calculated, ph} - \theta_{test\ source}}{FSR} \right]$$

where $\Theta_{calculated\_ph}$ is the phase angle per phase resulting from the conversion in step 305, $\Theta_{test\ source}$ is the phase angle configured in the test source 10 (and provided to the energy management component 23 by test source 10) and FSR is the fractional sample resolution calculated in step 307.

At step 309, the calibration application 24 then calculates a preload parameter to update ADC 21. The preload parameter may be calculated as TSD mod OSR, and is within a range from zero to OSR units. Using the value of the preload parameter, the ADC 21 may only be able to delay sampling up to, but not including, one whole sample. Thus, reconfiguring ADC 21 with an updated preload parameter may not fully calibrate the complete phase difference where a delay of one whole sample or more is needed. The energy measurement component 23 may be used in this instance to compensate for one or more whole sample delays and align voltage and current ADC samples by those whole sample delays. At step 310, the calibration application 24 calculates the number of whole sample delays using, for example, the following equation:

$$\text{whole sample delays} = \left\lfloor \frac{TSD}{OSR} \right\rfloor$$

where TSD is the total sample delay calculated at step 308 and OSR is the oversampling rate of ADC 21.

At step 311, the calibration computer 12 provides the preload parameter and/or whole sample delays to the microcontroller 22, which uses the preload parameter to reconfigure ADC 21 and/or the whole sample delays to reconfigure the energy measurement component 23 to align the phases of voltage and current samples (e.g., move the phase difference closer to zero) and improve power measurement accuracy.

The examples of the calibration computer 12 and calibration application 24 described herein allow for the calibration of sensor systems having different configurations. In addition, the examples of the calibration computer 12 and calibration application 24 described herein can be configured for use with different microcontrollers having integrated ADCs (e.g., ΣΔ ADCs), including TI MSP430 (e.g., models F67xxA or i20xx) and/or host microcontrollers with standalone ADCs (e.g., ΣΔ ADCs). Calibration computer 12 may be a personal computer (PC) or a host microcontroller.

The illustrative calibration systems and methods described herein are not dependent on the shape or size of the Rogowski coil, and may be used with Rogowski coils of different shapes and sizes. Moreover, the illustrative calibration systems and methods described herein may also be used with shunts or current transformers instead of Rogowski coils.

Calibration application 24 may be used to enter configuration information for the sensor system (e.g., through a graphical user interface). For example, calibration application 24 may be used to choose a type of sensor (e.g., Rogowski coil), configure the ADCs 19 and/or 21 by setting gain, preload, sampling frequency, OSR or system clock or configure the energy measurement component 23 by setting the number of phases or functional parameters (e.g., voltage, current, power, energy, frequency, power factor). Calibration application 24 may validate the configuration before the microcontroller 22 is programmed. Any one or more of the steps described above as being performed by the energy measurement component 23 may be performed by the microcontroller 22 executing the software libraries within the energy measurement component 23.

In examples described herein, logic implemented on energy measurement component 23 may instead be implemented on calibration application 24 and vice-versa. For example, the power factor may be converted to a phase angle in the energy measurement component 23 rather than the calibration application 24.

Modifications are possible in the described embodiments, and other embodiments are possible, within the scope of the claims.

What is claimed is:

1. A method for phase calibration of a current sensor, the method comprising:
   converting a first signal representing a measured current from a test source to a first digital signal using a first analog-to-digital converter;
   converting a second signal representing a measured voltage from the test source to a second digital signal using a second analog-to-digital converter;
   calculating a calculated phase angle between the first digital signal and the second digital signal;
   calculating a phase difference by subtracting a test source phase angle from the calculated phase angle;
   calculating a total sample delay between the first digital signal and the second digital signal by dividing the phase difference by a fractional sample resolution representing an angle that a phase of the first digital signal will shift based on changing a preload parameter of the first analog-to-digital converter by one unit, wherein the preload parameter represents a delay before the first analog-to-digital converter begins sampling; and
   calculating an updated preload parameter as the total sample delay modulo an oversampling rate of the first analog-to-digital converter.

2. The method of claim 1, further comprising calculating the fractional sample resolution by dividing a whole sample resolution by the oversampling rate, and the whole sample resolution is calculated by dividing a frequency of the test source by a sampling frequency of the first analog-to-digital converter and converting to degrees.

3. The method of claim 2, further comprising:
   calculating a number of whole sample delays with the following equation:

$$\text{whole sample delays} = \left\lfloor \frac{TSD}{OSR} \right\rfloor$$

wherein TSD is the total sample delay and OSR is the oversampling rate of the first analog-to-digital converter; and
   configuring with the number of whole sample delays an energy measurement component configured to calculate the calculated phase angle.

4. The method of claim 1, further comprising:
   configuring the first analog-to-digital converter with the updated preload parameter.

5. The method of claim 1, wherein the first analog-to-digital converter comprises a first sigma-delta analog-to-digital converter and the second analog-to-digital converter comprises a second sigma-delta analog-to-digital converter.

6. The method of claim 1, wherein the calculating of the calculated phase angle between the first and second digital signals comprises:

using the first and second digital signals to calculate an active power;
calculating a power factor based on the active power; and
converting the power factor to the calculated phase angle.

7. A method for gain calibration of active power, the method comprising:
using a microcontroller to convert a first signal representing a measured current to a first digital signal, wherein the first digital signal includes samples taken of the first signal;
using the microcontroller to convert a second signal representing a measured voltage to a second digital signal, wherein the second digital signal includes samples taken of the second signal, and wherein the samples taken of the first signal and the samples taken of the second signal are a number of samples;
determining an active power using the samples taken of the first signal and the samples taken of the second signal, an existing active power scaling factor, and the number of samples;
calculating an active power based on:
the samples taken of the first signal; the samples taken of the second signal; an existing active power scaling factor; and the number of samples;
calculating a phase angle between the first and second digital signals; and
using the existing active power scaling factor, a voltage value of a test source signal, a current value of the test source signal, the phase angle, and the active power to calculate an updated active power scaling factor.

8. The method of claim 7, further comprising:
configuring the microcontroller with the updated active power scaling factor.

9. The method of claim 8, further comprising:
generating code based on the updated active power scaling factor; and
providing the generated code to a memory in the microcontroller.

10. The method of claim 7, wherein the active power is calculated with the following equation:

$$P_{ACT,ph} = K_{ACT,ph} \times \frac{\sum_{n=1}^{Sample\ Count} v(n) \times i(n)}{Sample\ Count}$$

wherein $K_{ACT,ph}$ is the existing active power scaling factor, Sample Count is the number of samples taken of the first and second signals when creating the first and second digital signals, and v(n) and i(n) are, respectively, voltage and current measured at sample n.

11. The method of claim 7, wherein the updated active power scaling factor is calculated using the following equation:

$$K'_{ACT,ph} = K_{ACT,ph} \times \frac{V_{ideal} I_{ideal} \cos\theta_{calculated,\ ph}}{P_{ACT,\ ph}}$$

wherein $K_{ACT,ph}$ is the existing active power scaling factor, $V_{ideal}$ and $I_{ideal}$ are, respectively, the voltage and current values of the test source signals on which the second and first digital signals, respectively, are based, $\Theta_{calculated,ph}$ is the phase angle between the first and second digital signals and $P_{ACT,ph}$ is the active power.

12. The method of claim 7, wherein the calculating of a phase angle between the first and second digital signals comprises:
calculating a power factor; and
converting the power factor to the phase angle.

13. A system for calibrating a current sensor, the system comprising:
an energy measurement component configured to receive a first digital signal from a first analog-to-digital converter a second digital signal from a second analog-to-digital converter corresponding, respectively, to a first signal representing current measured from a test source and a second signal representing voltage measured from a test source, to calculate an active power based on the first and second digital signals and an existing scaling factor and to calculate a power factor based on the active power; and
a calibration computer configured to:
receive the active power and power factor from the energy measurement component;
convert the power factor to a converted phase angle;
calculate an updated scaling factor using the converted phase angle and the active power,
calculate a phase difference by subtracting a phase angle of the test source from the converted phase angle,
calculate a total sample delay between the first and second digital signals for the first analog-to-digital converter by dividing the phase difference by a fractional sample resolution representing an angle of a phase of the first digital signal based on changing a preload parameter of the first analog-to-digital converter by one unit, wherein the preload parameter represents a delay before the first analog-to-digital converter begins sampling, and
calculate an updated preload parameter as the total sample delay modulo an oversampling rate of the first analog-to-digital converter.

14. The system of claim 13, wherein the calibration computer is further configured to calculate the fractional sample resolution by dividing a whole sample resolution by the oversampling rate, and to calculate the whole sample resolution by dividing a frequency of the test source by a sampling frequency of the first analog-to-digital converter and converting the result to degrees.

15. The system of claim 13, wherein the calibration computer is further configured to calculate a number of whole sample delays with the following equation:

$$\text{whole sample delays} = \left\lfloor \frac{TSD}{OSR} \right\rfloor$$

wherein TSD is the total sample delay and OSR is the oversampling rate of the first analog-to-digital converter.

16. The system of claim 15, wherein the calibration computer is further configured to provide the updated preload parameter and the whole sample delays to a sensor system to reconfigure the first analog-to-digital converter with the updated preload parameter and reconfigure the energy measurement component with the whole sample delays.

17. The system of claim 13, wherein the first analog-to-digital converter comprises a first sigma-delta analog-todigital converter and the second analog-to-digital converter comprises a second sigma-delta analog-to-digital converter.

18. The system of claim 13, wherein the calibration computer is further configured to provide the updated scaling factor to the energy measurement component to reconfigure the energy measurement component.

19. The system of claim 13, wherein energy measurement component is configured to calculate the active power using the following equation:

$$P_{ACT,ph} = K_{ACT,ph} \times \frac{\sum_{n=1}^{Sample\ Count} v(n) \times i(n)}{Sample\ Count}$$

wherein $K_{ACT,ph}$ is an existing active power scaling factor, Sample Count is a number of samples taken of the voltage and current signals when creating the first and second digital signals, and v(n) and i(n) are, respectively, voltage and current measured at sample n.

20. The system of claim 13, wherein the calibration computer is further configured to calculate the updated scaling factor using the following equation:

$$K'_{ACT,ph} = K_{ACT,ph} \times \frac{V_{ideal} I_{ideal} \cos\theta_{calculated,ph}}{P_{ACT,ph}}$$

where $V_{ideal}$ and $I_{ideal}$ are, respectively, voltage and current values of test source signals on which the second and first digital signals are based, respectively, $\Theta_{calculated,ph}$ is the calculated phase angle between the first and second digital signals and $P_{ACT,ph}$ is the active power.

* * * * *